United States Patent
Liu

(10) Patent No.: US 10,290,743 B2
(45) Date of Patent: May 14, 2019

(54) METAL OXIDE THIN-FILM TRANSISTOR AND MANUFACTURING METHOD FOR THE SAME

(71) Applicant: Shenzhen China Star Optoelectronics Technology Co., Ltd., Shenzhen, Guangdong (CN)

(72) Inventor: Yang Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 212 days.

(21) Appl. No.: 15/300,045

(22) PCT Filed: Aug. 11, 2016

(86) PCT No.: PCT/CN2016/094684
§ 371 (c)(1),
(2) Date: Sep. 28, 2016

(87) PCT Pub. No.: WO2017/210995
PCT Pub. Date: Dec. 14, 2017

(65) Prior Publication Data
US 2018/0175205 A1    Jun. 21, 2018

(30) Foreign Application Priority Data
Jun. 7, 2016 (CN) .......................... 2016 1 0402878

(51) Int. Cl.
*H01L 29/786* (2006.01)
*H01L 21/027* (2006.01)
(Continued)

(52) U.S. Cl.
CPC ...... *H01L 29/7869* (2013.01); *H01L 21/0274* (2013.01); *H01L 21/47635* (2013.01);
(Continued)

(58) Field of Classification Search
CPC .................. H01L 29/78666; H01L 29/78672
See application file for complete search history.

(56) References Cited

U.S. PATENT DOCUMENTS 4,543,320 A    9/1985  Vijan
4,547,789 A    10/1985 Cannella
(Continued)

FOREIGN PATENT DOCUMENTS

CN    101320181 A    12/2008
CN    103730508 A    4/2014
(Continued)

*Primary Examiner* — Daniel Whalen
(74) *Attorney, Agent, or Firm* — Andrew C. Cheng

(57) ABSTRACT

The present invention relates to a metal oxide thin-film transistor and manufacturing for the same. The thin-film transistor includes a substrate; a source electrode, a barrier layer and a drain electrode which are sequentially formed on the substrate; and a semiconductor active layer formed on side surfaces of the source electrode and the drain electrode; wherein, the semiconductor active layer is respectively connected with the source electrode and the drain electrode. The metal oxide thin-film transistor has a new structure, wherein the source and drain electrodes are parallel to the substrate, and the semiconductor active layer is contacted with the source electrode and the drain electrode by a vertical covering or a step covering way. The channel length does not depend on the photolithography process, but depends on the side length of the source and drain electrodes contacted with the semiconductor active layer.

5 Claims, 4 Drawing Sheets

(51) Int. Cl.
    *H01L 21/4763*     (2006.01)
    *H01L 29/417*     (2006.01)
    *H01L 29/66*     (2006.01)
    H01L 29/10     (2006.01)
    H01L 27/12     (2006.01)
    H01L 29/45     (2006.01)

(52) U.S. Cl.
    CPC .. *H01L 29/41733* (2013.01); *H01L 29/66969* (2013.01); *H01L 29/78618* (2013.01); *H01L 29/78642* (2013.01); *H01L 29/78696* (2013.01); H01L 27/1225 (2013.01); H01L 27/1288 (2013.01); H01L 29/10 (2013.01); H01L 29/417 (2013.01); H01L 29/45 (2013.01)

(56) References Cited

U.S. PATENT DOCUMENTS

| | | | |
|---|---|---|---|
| 4,701,996 A * | 10/1987 | Calviello | H01L 29/8122 257/E29.05 |
| 2011/0101356 A1 | 5/2011 | Yamazaki | |
| 2014/0103307 A1* | 4/2014 | Chang | H01L 29/78642 257/40 |

FOREIGN PATENT DOCUMENTS

| | | |
|---|---|---|
| CN | 104022156 A | 9/2014 |
| CN | 104617115 A | 5/2015 |

\* cited by examiner

METAL OXIDE THIN-FILM TRANSISTOR AND MANUFACTURING METHOD FOR THE SAME

BACKGROUND OF THE INVENTION

1. Field of the Invention

The present invention relates to a wafer manufacturing field and a display technology field, and more particularly to a metal oxide thin-film transistor and a manufacturing method for the same.

2. Description of Related Art

In recent years, along with the increasing size of the liquid crystal display, a frequency of a driving circuit is continuously increased. The mobility of the conventional amorphous thin-film transistor is hard to meet the requirement is that a thin-film transistor having higher mobility has become a hot topic for companies and research and development staff. The thin-film transistor having high mobility includes a polysilicon thin film transistor and a metal oxide thin-film transistor. Wherein, although the polysilicon thin film transistor has a higher mobility, but the uniformity is poor and the manufacturing process is complicated so that the cost is higher and the productivity is lower. In comparison, the metal oxide thin-film transistor has a high mobility and uniformity are the same time, and a relative low manufacturing cost such that the metal oxide thin-film transistor is regarded as a key technology of a next flat display.

Along with the improvement of the performance of the display, the thin-film transistor requires a shorter channel. Because the thin-film transistor having a shorter channel has a larger a width to length ratio, the thin-film transistor can provide a larger switching current. As shown in FIG. 1, which is a structure of a conventional metal oxide thin-film transistor, in the manufacturing method for the conventional metal oxide thin-film transistor, a channel length L of the thin-film transistor is directly limited by a photolithography process such that it is more difficult to realize a shorter channel.

SUMMARY OF THE INVENTION

In order to overcome the drawbacks of the conventional art, the purpose of the present invention is to provide a new metal oxide thin-film transistor and manufacturing method for the same, which can solve the short channel problem of the thin-film transistor of the conventional art in order to increase the performance of the thin-film transistor.

The present invention includes two aspects, in one aspect, the present invention provides a metal oxide thin-film transistor, comprising: a substrate; a source electrode, a barrier layer and a drain electrode which are sequentially formed on the substrate; and a semiconductor active layer formed on side surfaces of the source electrode and the drain electrode; wherein, the semiconductor active layer is respectively connected with the source electrode and the drain electrode.

(For the source and the drain electrode 1) in a cross-sectional structure of the metal oxide thin-film transistor, each of the source electrode, the barrier layer and the drain electrode is a trapezoidal structure that a length of an upper surface is less than a length of a lower surface; a length of a lower surface of the barrier layer is the same as a length of an upper surface of the source electrode, and a length of a lower surface of the drain electrode is the same as a length of an upper surface of the barrier layer.

(For the source and the drain electrode 2) each of the source electrode, the barrier layer and the drain electrode is a trapezoidal structure that a length of an upper surface is less than a length of a lower surface; a length of a lower surface of the barrier layer is the same as a length of an upper surface of the source electrode, the drain electrode is formed on left and right sides of an upper surface of the barrier layer, and the drain electrode located at the left side of the barrier layer and the drain electrode located at the right side of the barrier layer are connected with each other.

(For the source and the drain electrode 3) in a cross-sectional structure of the metal oxide thin-film transistor, each of the source electrode, the barrier layer and the drain electrode is a trapezoidal structure that a length of an upper surface is less than a length of a lower surface; a length of a lower surface of the drain electrode is the same as a length of an upper surface of the barrier layer, a length of a lower surface of the barrier layer is less than a length of an upper surface of the source electrode such that a portion of the source electrode is exposed outside a covering range of the barrier layer.

Furthermore, a left side and a right side of the source electrode are respectively protruded from the barrier layer and the drain electrode, and are exposed outside a covering range of the barrier layer.

(The semiconductor layer-patterning) furthermore, the semiconductor active layer is a patterned semiconductor active layer, the patterned semiconductor active layer includes a first patterned semiconductor active layer located at and simultaneously contacted with a left side of the drain electrode and a left side of the source electrode, and a second patterned semiconductor active layer located at and simultaneously contacted with a right side of the drain electrode and a right side of the source electrode.

(The barrier layer) Optionally, the barrier layer is an insulation layer or a semiconductor barrier layer.

Optionally, the material of the insulation layer selects one or a combination of SiNx and SiOx.

Optionally, the material of the semiconductor barrier layer selects from one or a combination of a ZnO based, a $SnO_2$ based and an $In_2O_3$ based materials. It can be understood that the semiconductor barrier layer is a semiconductor layer with a high resistance.

(Further provided with GI) furthermore, a gate insulation layer is formed on the semiconductor active layer.

(A gate electrode is further provided) Furthermore, a gate electrode is formed on the gate insulation layer.

Furthermore, the gate electrode is a patterned gate electrode.

Furthermore, the patterned gate electrode is respectively located at left and right sides of the gate insulation layer, the patterned gate electrode located at the left side of the gate insulation layer is also correspondingly disposed above the first patterned semiconductor active layer, the patterned gate electrode located at the right side of the gate insulation layer is also correspondingly disposed above the second patterned semiconductor active layer, and the patterned gate electrode located at the left side and the patterned gate electrode located at the right side are connected with each other.

(A PV is further provided) furthermore, a passivation layer is formed on the patterned gate electrode.

Optionally, the material of the drain electrode selects one or a composite material of Al, Mo, Cu and Ag.

Optionally, the material of the source electrode selects one or a composite material of Al, Mo, Cu and Ag.

Optionally, the semiconductor active layer selects one or a combination of a ZnO based, an $In_2O_3$ based and a $SnO_2$ based material.

Optionally, the gate insulation layer selects one or a combination of SiNx and SiOx.

Optionally, the material of the gate electrode selects one or a composite material of Al, Mo, Cu and Ag.

Optionally, the passivation layer selects one or a combination of SiNx and SiOx.

In a second aspect, the present invention also provides a manufacturing method for the metal oxide thin-film transistor described above, comprising steps of:

preparing a substrate;

sequentially forming a source electrode, a barrier layer and a drain electrode on the substrate;

forming a semiconductor active layer on side surfaces of the source electrode and the drain electrode such that the semiconductor active layer is respectively connected with the source electrode and the drain electrode.

a substrate;

a source electrode, a barrier layer and a drain electrode which are sequentially formed on the substrate; and a semiconductor active layer formed on side surfaces of the source electrode and the drain electrode;

wherein, the semiconductor active layer is respectively connected with the source electrode and the drain electrode.

(The source and drain electrode-specifically) furthermore, the step of sequentially forming a source electrode, a barrier layer and a drain electrode on the substrate comprises forming a first metal layer on the substrate, forming a barrier layer on the first metal layer, forming a second metal layer on the barrier layer, performing a photolithography process to the second metal layer, the barrier layer and the first metal layer such that the first metal layer forms the source electrode and the second metal layer forms the drain electrode.

(Halftone or grayscale mask) furthermore, the step of performing a photolithography process to the second metal layer, the barrier layer and the first metal layer comprises adopting a half-tone mask and/or a grayscale mask to coating a photoresist; after exposing and developing, forming a photolithography pattern; and after etching and stripping the photoresist, forming the source electrode and the drain electrode.

(For the source and the drain electrode 1) in a cross-sectional structure of the metal oxide thin-film transistor, each of the source electrode, the barrier layer and the drain electrode is a trapezoidal structure that a length of an upper surface is less than a length of a lower surface; a length of a lower surface of the barrier layer is the same as a length of an upper surface of the source electrode, and a length of a lower surface of the drain electrode is the same as a length of an upper surface of the barrier layer.

(For the source and the drain electrode 2) each of the source electrode, the barrier layer and the drain electrode is a trapezoidal structure that a length of an upper surface is less than a length of a lower surface; a length of a lower surface of the barrier layer is the same as a length of an upper surface of the source electrode, the drain electrode is formed on left and right sides of an upper surface of the barrier layer, and the drain electrode located at the left side of the barrier layer and the drain electrode located at the right side of the barrier layer are connected with each other.

(For the source and the drain electrode 3) in a cross-sectional structure of the metal oxide thin-film transistor, each of the source electrode, the barrier layer and the drain electrode is a trapezoidal structure that a length of an upper surface is less than a length of a lower surface; a length of a lower surface of the drain electrode is the same as a length of an upper surface of the barrier layer, a length of a lower surface of the barrier layer is less than a length of an upper surface of the source electrode such that a portion of the source electrode is exposed outside a covering range of the barrier layer.

Furthermore, a left side and a right side of the source electrode are respectively protruded from the barrier layer and the drain electrode, and are exposed outside a covering range of the barrier layer.

(The semiconductor active layer-specifically) furthermore, the step of forming a semiconductor active layer on side surfaces of the source electrode and the drain electrode comprises performing a photolithography process to the semiconductor active layer in order to obtain a patterned semiconductor active layer, and the patterned semiconductor active layer includes a first patterned semiconductor active layer located at and simultaneously contacted with a left side of the drain electrode and a left side of the source electrode, and a second patterned semiconductor active layer located at and simultaneously contacted with a right side of the drain electrode and a right side of the source electrode.

(The barrier layer) Optionally, the barrier layer is an insulation layer or a semiconductor barrier layer.

Optionally, the material of the insulation layer selects one or a combination of SiNx and SiOx.

Optionally, the material of the semiconductor barrier layer selects from one or a combination of a ZnO based, a $SnO_2$ based and an $In_2O_3$ based materials. It can be understood that the semiconductor barrier layer is a semiconductor layer with a high resistance.

(The gate insulation layer) furthermore, the manufacturing method of the present invention further comprises a following step: forming a gate insulation layer on the semiconductor active layer.

(The gate electrode) furthermore, the manufacturing method of the present invention further comprises a following step: forming a gate electrode on the gate insulation layer.

(The gate electrode-specific photolithography) furthermore, the step of forming a gate electrode on the gate insulation layer is depositing a third metal layer, performing a photolithography process to the third metal layer to obtain a patterned gate electrode.

(The gate electrode-specifically) Furthermore, the patterned gate electrode is respectively located at left and right sides of the gate insulation layer, the patterned gate electrode located at the left side of the gate insulation layer is also correspondingly disposed above the first patterned semiconductor active layer, the patterned gate electrode located at the right side of the gate insulation layer is also correspondingly disposed above the second patterned semiconductor active layer, and the patterned gate electrode located at the left side and the patterned gate electrode located at the right side are connected with each other.

(The passivation layer) furthermore, the manufacturing method of the present invention further comprises a following step: forming a passivation layer on the patterned gate electrode.

(The material) Optionally, the material of the drain electrode selects one or a composite material of Al, Mo, Cu and Ag.

Optionally, the material of the source electrode selects one or a composite material of Al, Mo, Cu and Ag.

Optionally, the semiconductor active layer selects one or a combination of a ZnO based, an $In_2O_3$ based and a $SnO_2$ based material.

Optionally, the gate insulation layer selects one or a combination of SiNx and SiOx.

Optionally, the material of the gate electrode selects one or a composite material of Al, Mo, Cu and Ag.

Optionally, the passivation layer selects one or a combination of SiNx and SiOx.

Compared with the prior art, the beneficial effects of the present invention are as follows:

In a conventional metal oxide thin-film transistor, generally, sequentially forming a gate electrode, a gate insulation layer and a semiconductor active layer, and a source electrode and a drain electrode are respectively formed at two sides of the semiconductor active layer. However, in the above structure, a channel length of the thin-film transistor is limited by the precision of the photolithography process, which is hard to realize a shorter channel length. In the present invention, a new metal oxide thin-film transistor and manufacturing for the same are provided. A source electrode and a drain electrode are firstly formed on the substrate, and a barrier layer for separating the both is disposed such that the source electrode, the drain electrode and the barrier layer are in parallel to the substrate and the layers are in parallel to each other. Then a semiconductor active layer is respectively formed at left and right sides of the drain electrode and the source electrode as well. Then, a gate insulation layer and a gate electrode are formed. That is, the source and drain electrodes are in parallel to the substrate, and the semiconductor active layer is contacted with the source electrode and the drain electrode by a vertical covering or a step covering way in order to obtain a thin-film transistor totally different from the conventional thin-film transistor that the semiconductor active layer is in parallel with the substrate.

In the metal oxide thin-film transistor of the present invention, the channel length does not directly depend on the photolithography process, but depends on a length of a side surface of the source electrode and the drain electrode contacted with the semiconductor active layer. Because the structure is not limited by the complicated photolithography process, a thin-film transistor having a shorter channel can be manufactured in order to improve the device performance such as on-state current of the thin-film transistor, which can meet the display requirement for a higher performance.

Besides, in the metal oxide thin-film transistor of the present invention, through increasing a length of the source electrode on the substrate, the source electrode can fully function as a light-shielding layer in order to decrease the affection of the device performance by the backlight to the thin-film transistor, which can further increase the performance of the thin-film transistor.

Finally, in the metal oxide thin-film transistor of the present invention, through designing the drain electrode to be respectively located at two sides of the barrier layer and left and right sides of drain electrode are connected in a plane structure of the thin-film transistor. The advantage is that an overlap portion between the drain electrode and the gate electrode can be reduced in order to decrease the parasitic capacitance, and increase the performance of the thin-film transistor.

DETAILED DESCRIPTION OF THE PREFERRED EMBODIMENT

First Embodiment

Figure 1:
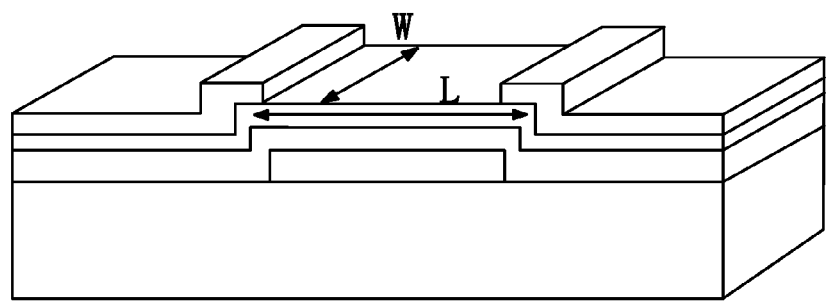
FIG. 1 is a schematic diagram of a metal oxide thin-film transistor of the conventional art.
Figure 2A:
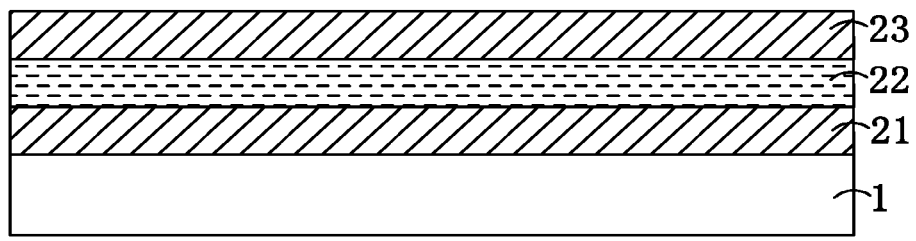
FIG. 2A to FIG. 2F are flow charts of the manufacturing method for the metal oxide thin-film transistor of a first embodiment of the present invention.

The present embodiment provides a manufacturing method for a metal oxide thin-film transistor, comprising following steps:

As shown in FIG. 2A, preparing a substrate 1, and through a sputtering method to sequentially deposit a first metal layer 21, a barrier layer 22 and a second metal layer 23. Wherein, each of the first metal layer and the second metal layer adopts metal molybdenum (Mo), and the barrier layer adopts a SiOx material. In the present embodiment, the barrier layer can be an insulation layer, or a semiconductor layer having a higher resistance, that is, a semiconductor layer with high resistance. When the barrier layer is an insulation layer, a SiNx material can also be adopted. When the barrier layer is a semiconductor layer with high resistance, a ZnO based, a $SnO_2$ based or an $In_2O_3$ based transparent oxide semiconductor material can be adopted. Each of the first metal layer and the second metal layer can also adopt other metal materials such as metal materials of Al, Cu and Ag.

Figure 2B:
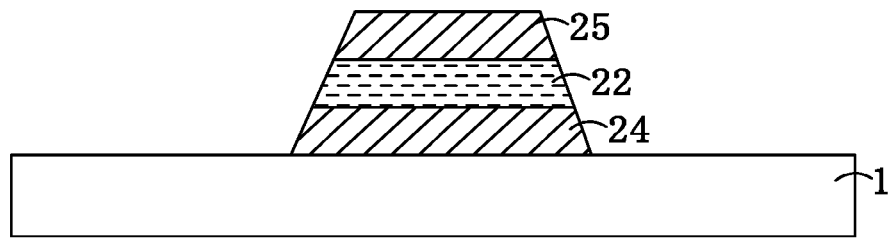

As shown in FIG. 2B, performing a photolithography process to the first metal layer, the barrier layer and the second metal layer. Specifically, coating a photoresist (not shown) on the second metal layer 23, using a half-tone mask for exposing, developing such that the first metal layer 21, the barrier layer 22 and the second metal layer 23 form photolithography patterns. Then, etching the first metal layer, the barrier layer and the second metal layer outside a protection range of the photoresist, and stripping the photoresist such that the first metal layer forms a source electrode 24, the second metal layer forms a drain electrode 25. In the present embodiment, from a cross-sectional structure of the metal oxide thin-film transistor (that is the structure shown in FIG. 2B). After photolithography, film layers which are in parallel to the substrate 1: the source electrode 24, the barrier layer 22 and the drain electrode 25 are formed. In the present embodiment, the source electrode 24, the barrier layer 22 and the drain electrode 25 are all continuous and complete film layers. Lengths of the film layers are gradually decreased from a lower surface to an upper surface such that in the cross-sectional structure of the metal oxide thin-film transistor, the source electrode 24, the barrier layer 22 and the drain electrode 25 form a trapezoid which is short at top and long at bottom. Wherein, a lower surface of the barrier layer 22 just covers an upper surface of the source electrode 24, a lower surface of the drain electrode 25 just covers an upper surface of the barrier layer 22. It can be understood that in the manufacturing method of the present embodiment, a grayscale mask can be adopted for exposing the first metal layer, the barrier layer and the second metal layer so that finally, a source electrode and a drain electrode having photolithography patterns can be obtained.

Figure 2C:
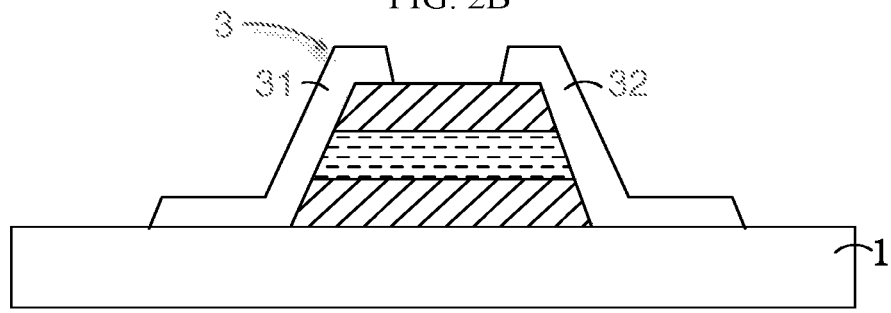

As shown in FIG. 2C, using a sputtering method to deposit a ZnO based material on surfaces of the substrate 1, the source electrode 24, the barrier layer 22 and the drain electrode 25 which are exposed outside as a semiconductor active layer, and performing a photolithography process. Specifically, coating a photoresist on the semiconductor active layer, exposing and developing in order to form a photolithography pattern. Then, etching and stripping the photoresist in order to form a patterned semiconductor active layer 3. The patterned semiconductor active layer 3 includes a first patterned semiconductor active layer 31 located at and simultaneously contacted with a left side of the drain electrode 25 and a left side of the source electrode 24, and a second patterned semiconductor active layer 32 located at and simultaneously contacted with a right side of the drain electrode 25 and a right side of the source electrode 24. Besides, the patterned semiconductor active layer 3 is respectively contacted with a left side and a right side of the barrier layer 22. It can be understood that the semiconductor active layer can also adopt a $SnO_2$ based or an $In_2O_3$ based transparent oxide semiconductor material.

In the present embodiment, from a cross-sectional structure of the metal oxide thin-film transistor (that is the structure shown in FIG. 2C) the patterned semiconductor active layer is contacted with the source electrode and the drain electrode respectively at left and right sides of the source electrode and the drain electrode. Therefore, the channel is formed at left and right sides of the source electrode and the drain electrode. That is, the channel length of the thin-film transistor of the present embodiment depends on lengths at left and right sides of the source electrode and drain electrode, which is not limited by the condition of the photolithography process anymore. Accordingly, the thin-film transistor of the present embodiment can realize a short channel structure.

Figure 2D:
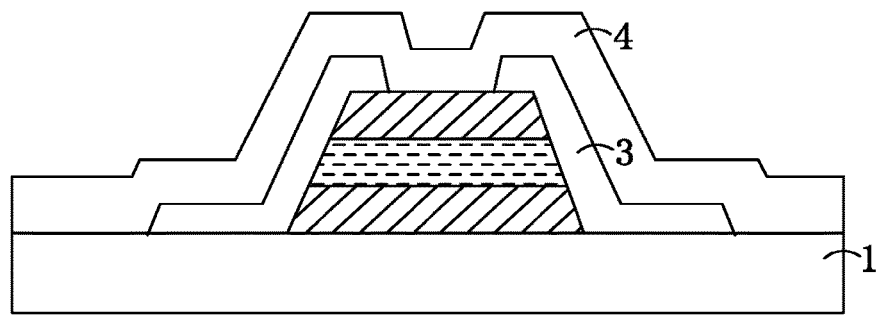

As shown in FIG. 2D, using a sputtering method to deposit SiOx as a gate insulation layer 4 on surfaces of the substrate 1, the patterned semiconductor active layer 3 and the drain electrode 25 which are exposed outside. The gate insulation layer can also adopt an insulation material of SiNx or $Al_2O_3$.

Figure 2E:
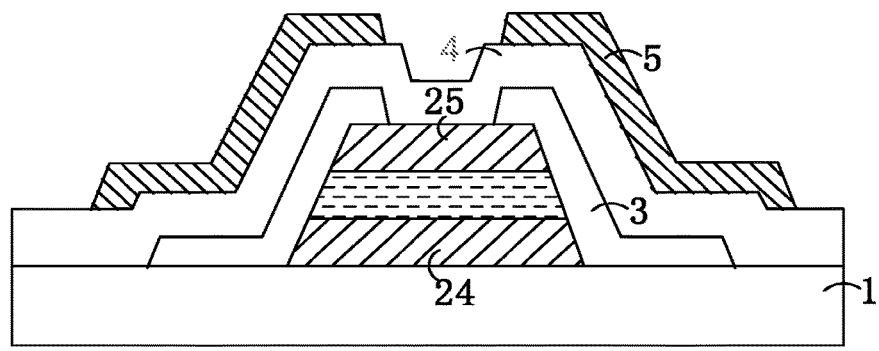

As shown in FIG. 2E, using a sputtering method to deposit metal molybdenum (Mo) on the gate insulation layer 4 as a third metal layer, and performing a photolithography process to the third metal layer. Specifically, coating a photoresist on the third metal layer, exposing and developing to form a photolithography pattern. Then, etching and stripping the photoresist to form a patterned gate electrode 5. From a cross-sectional structure of the metal oxide thin-film transistor (that is the structure shown in FIG. 2E), the gate electrode 5 are respectively located at left and right sides of the gate insulation layer 4. However, as shown in FIG. 2G, from a perspective view of a plane structure of the metal oxide thin-film transistor, the gate electrode located at a left side is connected with the gate electrode located at a right side in the plane structure of the metal oxide thin-film transistor. It can be understood that, in order to clearly show the connection property of the gate electrode in the plane structure of the metal oxide thin-film transistor, in FIG. 2G, only partial main structures of the metal oxide thin-film transistor are shown, including the source electrode, the drain electrode, the barrier layer, the patterned semiconductor active layer and the gate electrode.

Figure 2F:
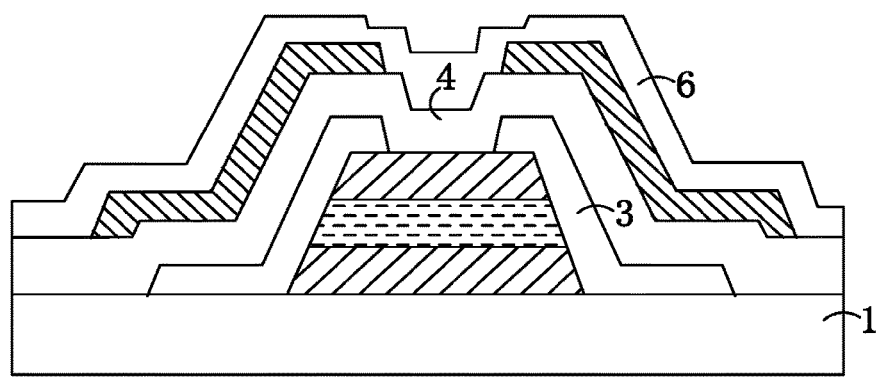
Figure 2G:
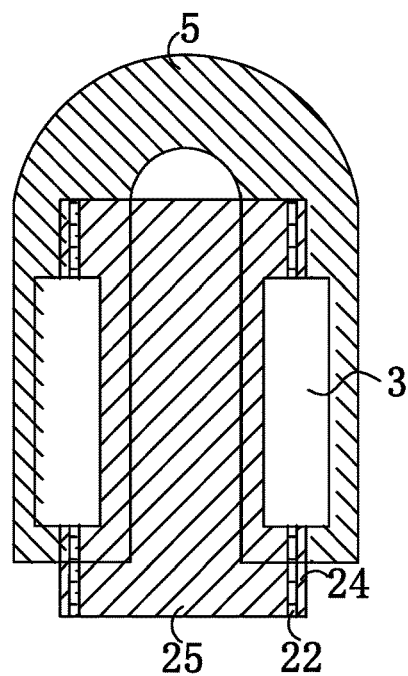
FIG. 2G is a perspective view of a plane structure of a metal oxide thin-film transistor of first embodiment of the present invention.

As shown in FIG. 2F, through a sputtering method to deposit SiNx on surfaces of the gate insulation layer 4 and the gate electrode 5 which are exposed outside as a passivation layer 6.

It can be understood that the manufacturing method of the present embodiment for depositing the first metal layer, the second metal layer, the third metal layer and the semiconductor active layer can also adopt one of the evaporation and sol-gel method. The manufacturing method of the present embodiment for depositing the gate insulation layer, the passivation layer and the barrier layer can also adopt a chemical vapor deposition.

Figure 3:
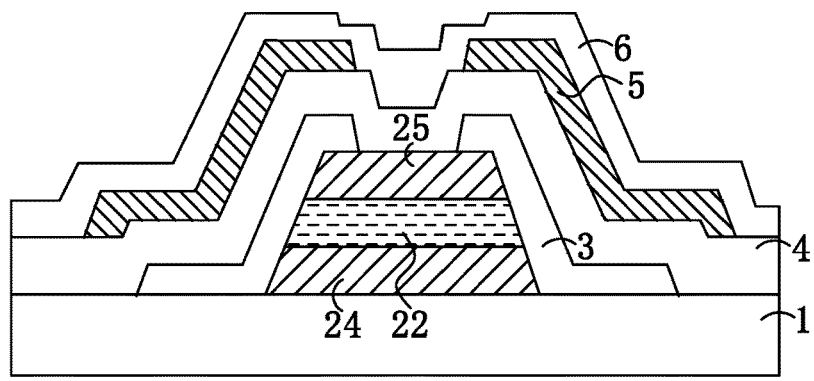
FIG. 3 is a schematic diagram of a cross-sectional structure of a metal oxide thin-film transistor of first embodiment of the present invention.

The present embodiment further provides a metal oxide thin-film transistor manufactured by the above method, as shown in FIG. 3, the metal oxide thin-film transistor includes a substrate 1; a source electrode 24, a barrier layer 22 and a drain electrode 25 which are sequentially formed on the substrate 1; a patterned semiconductor active layer 3 respectively formed on left and right sides of the source electrode 24 and the drain electrode 25; a gate insulation layer 4 formed on surfaces of the substrate 1, the patterned semiconductor active layer 3, the drain electrode 25 which are exposed outside; and a gate electrode 5 formed at left and right sides of the gate insulation layer 4, wherein the gate electrode located at left side and the gate electrode located at right side are connected in a plane structure of the metal oxide thin-film transistor. In the present embodiment, the source electrode and the drain electrode are both disposed on the substrate in parallel to a plane structure of the substrate. The patterned semiconductor active layer is disposed at left and right sides of the source electrode and drain electrode in a vertical covering or a step covering way. That is, side lengths of the source electrode and the drain electrode decide a channel length of the thin-film transistor. The above structure is not limited by the photolithography process, and belongs to a new metal oxide thin-film transistor, which can realize a short channel structure of the metal oxide thin-film transistor.

In the present embodiment, the material adopted by each film layer of the metal oxide thin-film transistor is the material described in the above manufacturing method, no more repeating here.

Second Embodiment

Figure 4A:
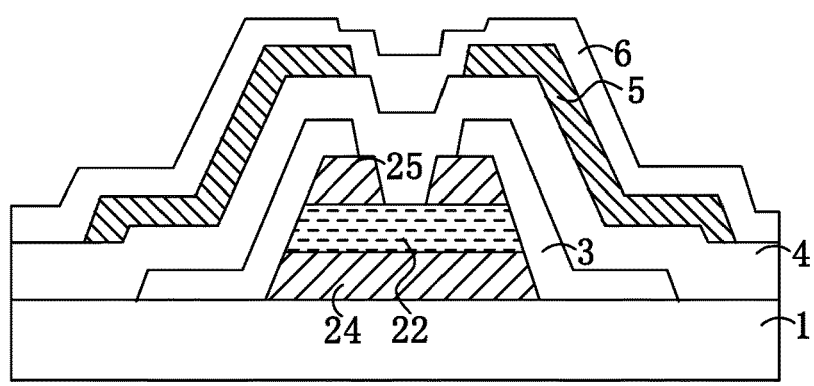
FIG. 4A is a schematic diagram of a cross-sectional structure of a metal oxide thin-film transistor of a second embodiment of the present invention.
Figure 4B:
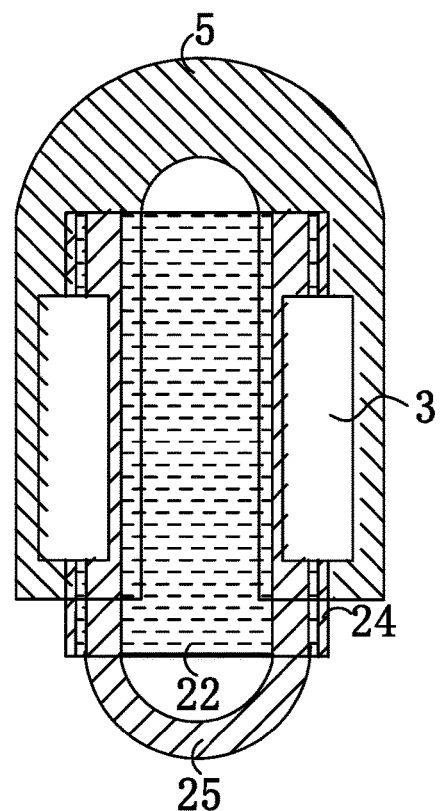
FIG. 4B is a perspective view of a plane structure of a metal oxide thin-film transistor of the second embodiment of the present invention.

The difference between the present embodiment and the first embodiment is that, as shown in FIG. 4A, after performing a photolithography process to the first metal layer, the barrier layer and the second metal layer, from a cross-sectional structure of the metal oxide thin-film transistor, the drain electrode 25 after photolithography process are respectively located at left and right sides of an upper surface of the barrier layer 22 such that a middle portion of the upper surface of the barrier layer 22 is exposed. At the same time, as shown in FIG. 4B, from a top view of a plane structure of the metal oxide thin-film transistor, the drain electrode located at a left side and the drain electrode located at a right side are connected. It can be understood that, in order to clearly show the connection property of the drain electrode in the plane structure of the metal oxide thin-film transistor, in FIG. 4B, only partial main structures of the metal oxide thin-film transistor are shown, including the source electrode, the drain electrode, the barrier layer, the patterned semiconductor active layer and the gate electrode.

The metal oxide thin-film transistor obtained by the manufacturing method of the present embodiment, although from the plane structure of the metal oxide thin-film transistor, the drain electrode is a continuous structure, however, from a cross-sectional structure of the metal oxide thin-film transistor, the drain electrode are respectively located at left side and right side of the upper surface of the barrier layer. The above structure can make an overlap portion between the gate electrode and the drain electrode to be reduced in order to reduce the parasitic capacitance and increase the performance of the thin-film transistor.

Third Embodiment

Figure 5:
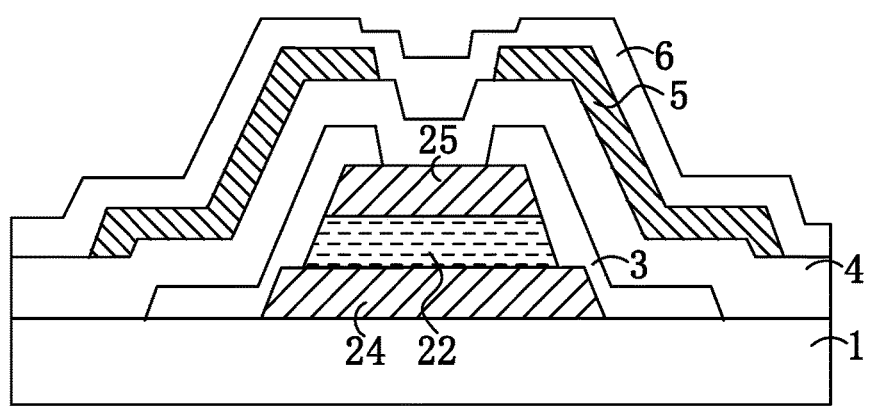
FIG. 5 is a schematic diagram of a cross-sectional structure of a metal oxide thin-film transistor of a third embodiment of the present invention.

The difference between the present embodiment and the manufacturing method in the first embodiment is that, when performing a photolithography process to the first metal layer, the barrier layer and the second metal layer, a grayscale mask is adopted for exposing and developing. Finally, as shown in FIG. 5, from a cross-sectional structure of the metal oxide thin-film transistor, a lower surface of the barrier layer 22 only covers a portion of the source electrode, after the photolithography process, a length of an upper surface of the source electrode 24 is greater than a length of a lower surface of the barrier layer 22. That is, a left side and a right side of the source electrode 24 are respectively protruded from the barrier layer 22 and the drain electrode 25, and are exposed outside a covering range of the barrier layer 22 and the drain electrode 25.

The metal oxide thin-film transistor obtained by the manufacturing method of the present embodiment, from the cross-sectional structure of the metal oxide thin-film transistor, because the length of the source electrode on the substrate is increased, the source electrode can be fully used as a light-shielding layer in order to reduce the affection of the backlight to the property of the thin-film transistor so as to further increase the performance of the thin-film transistor.

The above description only illustrates the main structure of the metal oxide thin-film transistor, and the metal oxide thin-film transistor can also include other normal functional structures, no more repeating here.

The above embodiment does not constitute a limitation of the scope of protection of the present technology solution. The person skilled in the art can understand: without exceeding the principle and spirit of the present invention, the above embodiments can be improved. Any modifications, equivalent replacements and improvements based on the spirit and principles of the above embodiments should also be included in the protection scope of the present technology solution.

What is claimed is:

1. A metal oxide thin-film transistor, comprising:
   a substrate;
   a source electrode, a barrier layer and a drain electrode which are sequentially formed on the substrate; and
   a semiconductor active layer formed on side surfaces of the source electrode and the drain electrode;
   wherein, the semiconductor active layer is respectively connected with the source electrode and the drain electrode; and
   wherein, each of the source electrode, the barrier layer and the drain electrode is a trapezoidal structure that a length of an upper surface is less than a length of a lower surface; a length of a lower surface of the barrier layer is the same as a length of an upper surface of the source electrode, the drain electrode is formed on left and right sides of an upper surface of the barrier layer, and the drain electrode located at the left side of the barrier layer and the drain electrode located at the right side of the barrier layer are connected with each other.

2. The metal oxide thin-film transistor according to claim 1, wherein, the semiconductor active layer is a patterned semiconductor active layer, the patterned semiconductor active layer includes a first patterned semiconductor active layer located at and simultaneously contacted with a left side of the drain electrode and a left side of the source electrode, and a second patterned semiconductor active layer located at and simultaneously contacted with a right side of the drain electrode and a right side of the source electrode.

3. The metal oxide thin-film transistor according to claim 2, wherein, a gate insulation layer is formed on the semiconductor active layer, a patterned gate electrode is formed on the gate insulation layer, the patterned gate electrode is respectively located at left and right sides of the gate insulation layer, the patterned gate electrode located at the left side of the gate insulation layer is also correspondingly disposed above the first patterned semiconductor active layer, the patterned gate electrode located at the right side of the gate insulation layer is also correspondingly disposed above the second patterned semiconductor active layer, and the patterned gate electrode located at the left side and the patterned gate electrode located at the right side are connected with each other.

4. A metal oxide thin-film transistor, comprising:
   a substrate;
   a source electrode, a barrier layer and a drain electrode which are sequentially formed on the substrate; and
   a semiconductor active layer formed on side surfaces of the source electrode and the drain electrode;
   wherein, the semiconductor active layer is respectively connected with the source electrode and the drain electrode; and
   wherein, the semiconductor active layer is a patterned semiconductor active layer, the patterned semiconductor active layer includes a first patterned semiconductor active layer located at and simultaneously contacted with a left side of the drain electrode and a left side of the source electrode, and a second patterned semiconductor active layer located at and simultaneously contacted with a right side of the drain electrode and a right side of the source electrode.

5. The metal oxide thin-film transistor according to claim 4, wherein, a gate insulation layer is formed on the semiconductor active layer, a patterned gate electrode is formed on the gate insulation layer, the patterned gate electrode is respectively located at left and right sides of the gate insulation layer, the patterned gate electrode located at the left side of the gate insulation layer is also correspondingly disposed above the first patterned semiconductor active layer, the patterned gate electrode located at the right side of the gate insulation layer is also correspondingly disposed above the second patterned semiconductor active layer, and the patterned gate electrode located at the left side and the patterned gate electrode located at the right side are connected with each other.

* * * * *